United States Patent
Zin et al.

(10) Patent No.: US 9,293,452 B1
(45) Date of Patent: Mar. 22, 2016

(54) ESD TRANSISTOR AND A METHOD TO DESIGN THE ESD TRANSISTOR

(75) Inventors: Nor Razman Md Zin, Kulim (MY); Yanzhong Xu, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 294 days.

(21) Appl. No.: 12/896,294

(22) Filed: Oct. 1, 2010

(51) Int. Cl.
H01L 27/02 (2006.01)

(52) U.S. Cl.
CPC ........ H01L 27/0288 (2013.01); H01L 27/0292 (2013.01)

(58) Field of Classification Search
CPC ............ H01L 27/0248; H01L 27/0292; H01L 27/0288; H01L 27/0266
USPC ......... 257/363, 355, 356, 360, 146, 153, 173, 257/587, 580, 582, E29.176, E21.37, 257/E29.174, E21.608, E29.255
See application file for complete search history.

(56) References Cited

U.S. PATENT DOCUMENTS

| | | | | |
|---|---|---|---|---|
| 6,587,320 B1 * | 7/2003 | Russ et al. | ...................... | 361/56 |
| 7,005,708 B2 * | 2/2006 | Mergens et al. | .............. | 257/360 |
| 7,671,416 B1 * | 3/2010 | O et al. | ......................... | 257/360 |
| 2009/0279219 A1 * | 11/2009 | Yu | ................................... | 361/56 |
| 2010/0109775 A1 * | 5/2010 | Kamakura et al. | ........... | 330/260 |

OTHER PUBLICATIONS

Okushima, M. et al., "Layout technique to alleviate soft failure for short pitch multi finger ESD protection devices," 29th Electrical Overstress/Electrostatic Discharge Symposium, 2007. EOS/ESD, pp. 1A.5-1-1A.5-10, Sep. 16-21, 2007.*

Verhaege, K.G. et al. "Novel design of driver and ESD transistors with significantly reduced silicon area," Electrical Overstress/Electrostatic Discharge Symposium, 2001. EOS/ESD '01, pp. 1-12, Sep. 11-13, 2001.*

* cited by examiner

*Primary Examiner* — Zandra Smith
*Assistant Examiner* — Lauren R Bell
(74) *Attorney, Agent, or Firm* — Womble Carlyle Sandridge & Rice LLP

(57) ABSTRACT

An IC design that has an ESD transistor is disclosed. The IC includes a transistor, a ballast resistor, a routing structure and a coupling. The transistor includes a gate, a source and a drain. The ballast resistor is extending parallel to the gate of the transistor. The coupling connects the source of the drain of the transistor the ballast resistor. The routing structure connects the ballast resistor to the remaining of the circuitry. A method to design the IC is also disclosed. The ESD transistor provides means of protection against the ESD surges.

20 Claims, 6 Drawing Sheets

ESD TRANSISTOR AND A METHOD TO DESIGN THE ESD TRANSISTOR

BACKGROUND

Electrostatic discharge (ESD) is defined as a sudden and momentary electric current that flows between objects. ESD occurs when there is a significant electrical potential difference in between two objects. ESD may occur through a direct contact or through an electrostatic field induction. ESD is a common problem in a semiconductor industry and poses a serious threat to integrated circuits (ICs) in particular. ICs may suffer permanent damage when subjected to the relatively high voltages that occur during ESD events. As a result, there are now a number of ESD protective devices that help to prevent permanent damage.

The circuitry commonly used to protect ICs during an ESD event is an ESD transistor. The ESD transistor only permits a constant current between input and output (TO) paths. Such feature of only permitting a constant current provides protection against damages to the IC in the event of ESD. The ESD transistor functions like a ballast resistor towards the ESD current. In the event of ESD, the ballast resistor provides protection to critical circuitries within the ICs.

As the IC industry moves from one process node to another, the ESD transistor has moved from a design to another design accordingly. At different process nodes, different design rules are applicable. The ESD transistor designs that work on a former process might not work for a different process node. In addition, for newer generation process nodes, the distance in between structures within the IC continues to shrink. Ballast resistance is a function that depends on distances the ESD current propagates on the ballast resistor. The ballast resistor design from the older process generation, typically, may not function as effectively on the newer generation process. As the ESD transistor structure shrinks, the ballast resistance effectiveness decreases and the ESD transistor may be unable to be placed in a smaller node.

It is within this context that the embodiments described herein arise.

SUMMARY

Embodiments of present invention provide an ESD transistor and a method to design the ESD transistor.

It should be appreciated that the present invention can be implemented in numerous ways, such as a process, an apparatus, a system, a device, or a method. Several inventive embodiments of the present invention are described below.

In one embodiment, an IC that has an ESD transistor is described. The IC includes a transistor, a ballast resistor, routing structures, and couplings. The transistor further includes a gate, a source and a drain. The ballast resistor is placed adjacent to the transistor and extends parallel to the gate of the transistor. In one embodiment the ballast resistor is placed on a non-diffused area of the IC. The ballast resistor is connected to the source or the drain by a coupling. The coupling includes a metal strip disposed in a layer located above the transistor and a first connector that connects the metal strip to the diffused area and a second connector that connects the metal strip to the ballast resistor. The first and second connectors are located in a plane perpendicular to the plane where ballast resistor is placed. The metal strip is in the plane parallel to the ballast resistor. A routing structure connects the ballast resistor to remainders of the IC. The routing structure includes a metal strip and a connector. The connector, for the routing structure, connects the ballast resistor to the metal strip. The connector is in a plane perpendicular to the ballast resistor and the metal strip is parallel to the ballast resistor in one embodiment.

In another embodiment, a method to design the IC with the ESD transistor is described. The method includes designing two diffused regions with a different dopant type than the dopant on the substrate. Then, a gate composed of a polysilicon or a metallic material, wherein the gate has the purpose of switching on or off for the transistor, is placed in between the diffusion area, i.e., the two diffused regions. Another gate composed of a polysilicon material and also referred as the ballast resistor or dummy gate is placed adjacent to one of the two diffused regions. Couplings are designed to connect the diffused region to the ballast resistor or the dummy gate. Then, the routing structures are designed to connect the ballast resistor or the dummy gate to the remainder of the IC. The routing structure and the coupling are positioned sequentially in alternating fashion along the ballast resistor or the dummy gate in one embodiment. The distance between the sequential coupling and routing structure is adjusted to attain an optimized ballast resistance.

BRIEF DESCRIPTION OF THE DRAWINGS

The invention may be understood by reference to the following description taken in conjunction with the accompanying drawings.

DETAILED DESCRIPTION

The following embodiments describe an Electrostatic Discharge (ESD) transistor and a method to design the ESD transistor.

It will be obvious, however, to one skilled in the art, that the present invention may be practiced without some or all of these specific details. In other instances, well-known operations have not been described in detail in order not to unnecessarily obscure the present invention.

The embodiments described below illustrate an ESD transistor and a method to design the ESD transistor. The ESD transistor provides protection against electrical surges to vital circuitries within the IC. The ESD transistor adheres to the limitations for each process technology node and is designed to provide effective protection against electrical surges. The ESD transistor functions as a ballast resistor towards ESD surges, as will be illustrated in one embodiment. In addition, the ESD transistor provides for area savings on a substrate. The embodiments also describe a method to designing the ESD transistor and obtaining the desired ballast resistance.

Figure 1:
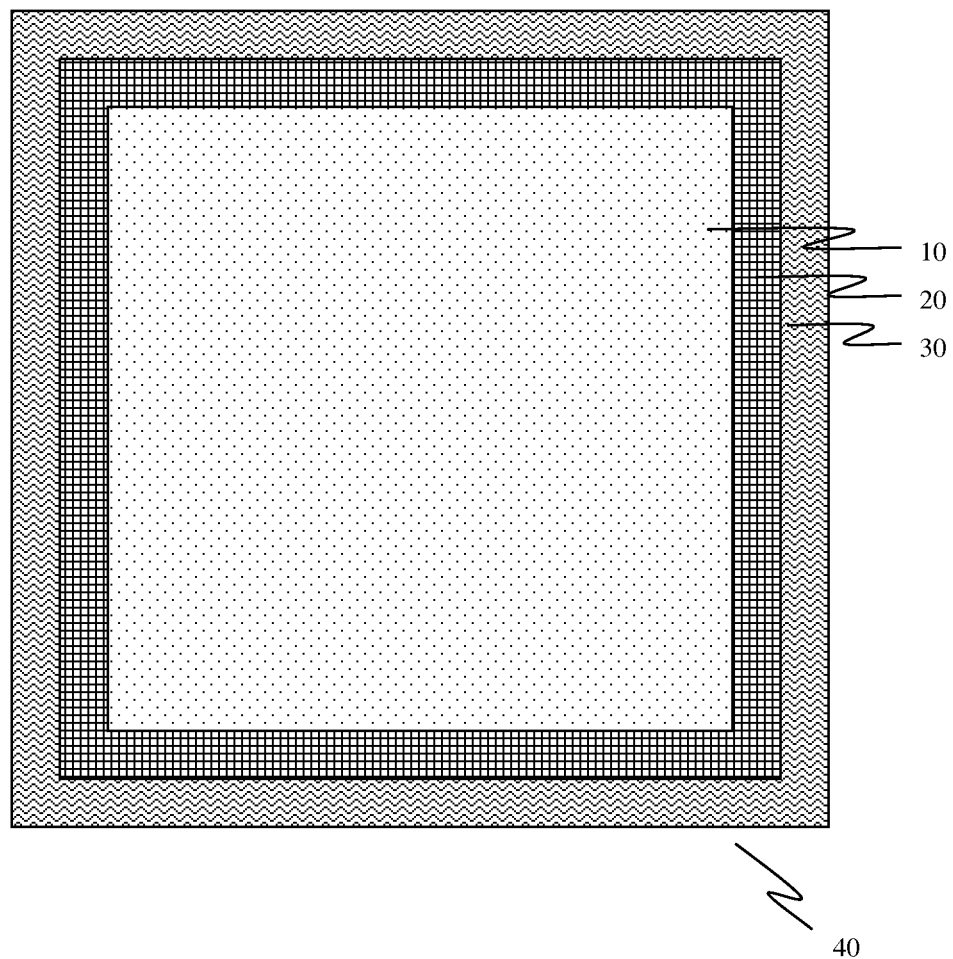
FIG. 1, meant to be illustrative and not limiting, illustrates an IC layout separated by functionalities in accordance with one embodiment.

FIG. 1, meant to be illustrative and not limiting, illustrates an IC layout separated by functionalities. The IC 40 includes a core fabric 10, an ESD protective area 20 and Input Output (IO) area 30. The core fabric 10 includes circuitries that define the ICs functionalities. The core fabric 10 can be represented by different circuitries e.g., Logic Elements (LE) for a Field Programmable Gate Array (FPGA), memory elements for Dynamic Random Access Memory (DRAM), etc., depending upon the functionalities of the IC 40. The IO area 30 provides a gateway to external interfaces. The IO area 30 functionalities include (i) transferring signals from the external interfaces to the core fabric 10 or (ii) transferring signals from the core fabric 10 to the external interfaces. In one embodiment, the IO area 30 is located at the peripherals of the IC 40. The ESD protective area 20 is located in between the core fabric 10 and IO area 30, on the same plane. The ESD protective area 20 provides protection to the core fabric 10 against ESD surges, such as voltage spikes or current spikes. The ESD protective area 20 includes ESD transistors. The ESD transistor provides a ballast resistance to voltage or current surges. The ballast resistor is defined as a resistor that maintains a substantially constant current flow by compensating for fluctuations, such as ESD surges, through increasing the resistance when the current increases. In the event of the ESD surge, a voltage spike increases the potential difference across the external interface and the IC 40 that incurs a high current flowing through the IO area 30. The ballast resistor property of the ESD transistor within the ESD protective area 20 then varies the ballast resistance accordingly towards the incoming current and limits the current to a level that can be tolerated by the core fabric 10. The ESD transistor design in the ESD protective area 20 varies based on design rules, process limitations and types of expected ESD surges.

Figure 2A:
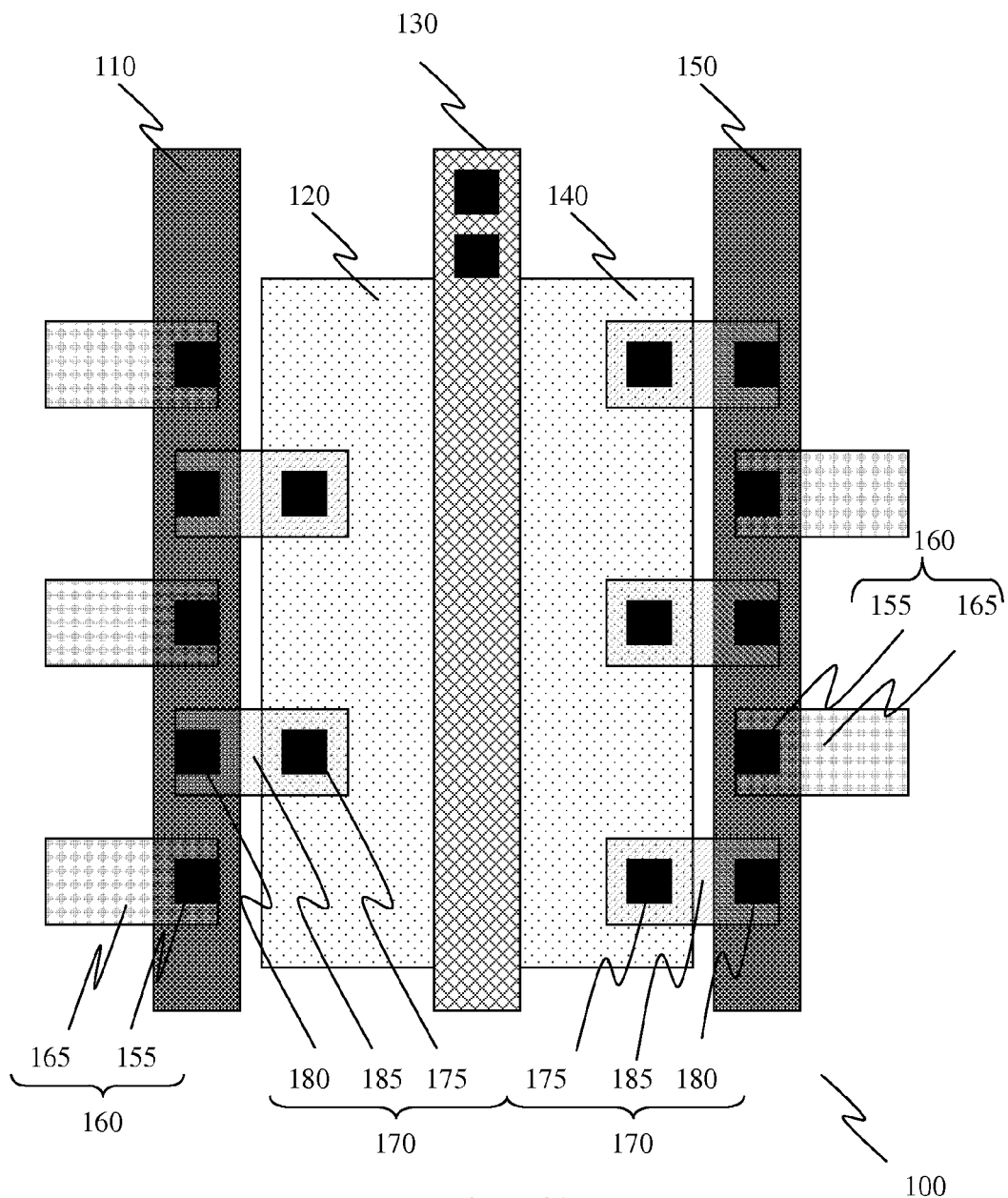
FIG. 2A, meant to be illustrative and not limiting, illustrates layout of an ESD transistor in accordance with one embodiment.

FIG. 2A, meant to be illustrative and not limiting, illustrates a layout of the ESD transistor in accordance with one embodiment. The ESD transistor 100 includes a source diffused area 120, a drain diffused area 140, a first gate 130, dummy gates 110 and 150, a plurality of couplings 170 and a plurality of routing structures 160. Each of the couplings 170 includes a metal strip 185, a first connector 175 and a second connector 180. Each of the routing structures 160 includes a metal strip 165 and a connector 155. The source diffused area 120, the drain diffused area 140 and the first gate 130 is grouped as a transistor within the ESD transistor 100. The first gate 130 is in between the source diffused area 120 and the drain diffused area 140. The dummy gates 110 and 150 are located in a non-diffused area and adjacent to diffused area. In another embodiment, the dummy gates 110 and 150 are known as ballast resistors. The ballast resistor provides a ballast resistance which, provides ESD protection functionality to the ESD transistor 100. The dummy gates 110 and 150 are also located within close proximity to the diffused areas. In one embodiment, the first gate 130 and the dummy gates 110 and 150 are composed from polysilicon or metallic materials. One skilled in the art appreciates that the polysilicon material can be doped with either N-type materials or P-type materials for altering the conductivity properties. The properties of polysilicon in dummy gates 110 and 150 can be altered to attain an optimized ballast resistance for the ESD transistor 100. The first gate 130 is disposed above a substrate and extends in a direction along the surface of the substrate. The dummy gates 110 and 150 are placed substantially parallel to the first gate 130. One skilled in the art appreciates that parallelism between the dummy gate 110 and 150 to the first gate 130 depends on the process capabilities. Therefore, the parallelism is subjected to process variation and tolerances of a given process node.

Still referring to FIG. 2A, the coupling 170 provides a signal connection from the diffused area 140 to the dummy gate 150. Within the coupling 170, the metal strip 185 is connected to the drain diffused area 140 or source diffused area 120 through the first connector 175. Also within the coupling 170, the metal strip 185 is connected to the dummy gate 150 or the dummy gate 110 through the second connector 180. The metal strip 185 is placed in a metal layer above the substrate. A person skilled in the art appreciates that a metal layer in semiconductor devices is composed of aluminum or copper signal routing structures. In addition, the connector, e.g. connectors 155,175 and 185, interconnect one layer to another layer and are typically a conductive through hole via. In one embodiment, the first connector 175 provides an interconnection from a bottom surface of the metal strip 185 located in a metal layer above the substrate to an upper surface of the drain diffused area 140. The second connector 185 provides an interconnection from the bottom surface of the metal strip 185 to an upper surface of the dummy gate 150. The first connector 175 and the second connector 185 are oriented perpendicular to the plane of first gate 130. The routing structure 160 includes metal strip 165 and a connector 155. The routing structure 160 provides a signal path from the dummy gate 150 to remaining circuitries of the IC. The metal strip 165 is located in a metal layer above the substrate. The connector 155 interconnects a bottom surface of the metal strip 165 to an upper surface of the dummy gate 140. The ESD transistor 100 includes a plurality of the couplings 170 and a plurality of the metal routings 160 disposed sequentially along the dummy gate 110 or 150. In one embodiment, the distance between each sequential coupling and metal routing determines the ballast resistance of the ESD structure 100. It should be appreciated that the distance between sequential coupling 170 and metal routing 160 among the plurality of couplings 170 and metal routings 160 is either (i) fixed or (ii) varied along the dummy gate. The connecting area depends on the process capabilities, e.g., through hole via diameter size.

Figure 2B:
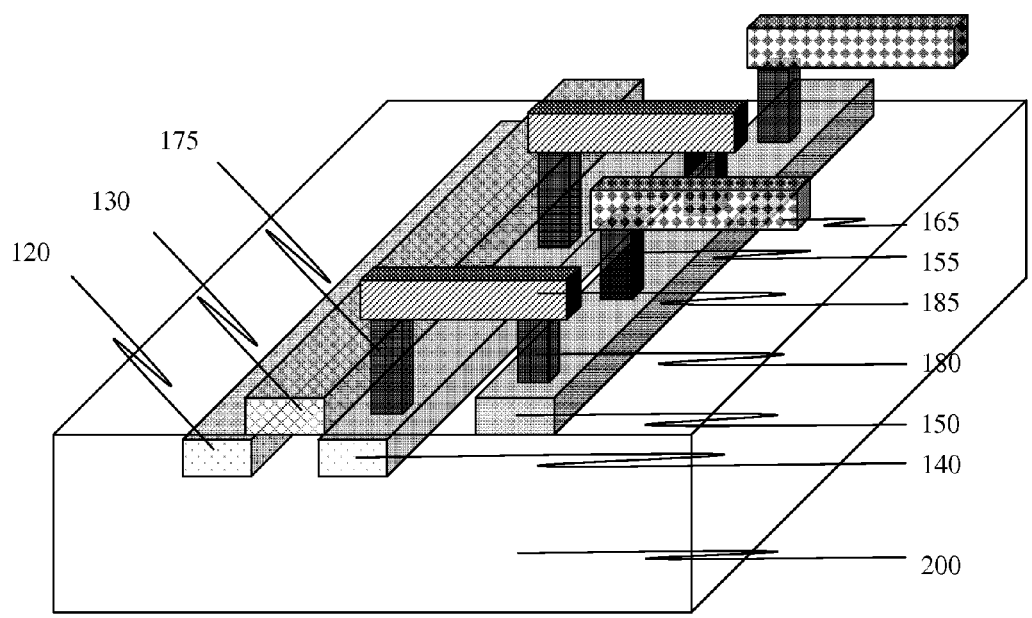
FIG. 2B, meant to be illustrative and not limiting, is a 3 Dimensional illustration of the ESD transistor in accordance with one embodiment.

FIG. 2B, meant to be illustrative and not limiting, illustrates a 3 Dimensional illustration of the ESD transistor. The ESD transistor includes elements described in FIG. 2A on top of a substrate 200. The substrate 200 is composed of semiconductor material, e.g., silicon or germanium arsenide. During an ESD surge, an ESD current proceeds through the ESD transistor. The ESD current goes from the source diffused area 120 to the drain diffused area 140 through the first gate 130. The first gate 130 is in an "on" state during the propagation of input or output signals. The ESD current flows from the drain diffused area 140 to the dummy gate 150, through the first connector 175, then the metal strip 185 and finally through the second connector 180. The ESD current then flows along the dummy gate 150 from second connector 180 to the connector 155. The dummy gate 150 provides the ballast resistance to the ESD current. The dummy gate 150 increases the resistance when the ESD current, typically a high current, is flowing through. Under normal conditions, the dummy gate 150 remains within the desired operating range thereby providing a moderate resistance. The ESD current then flows to the remainder of the IC from the metal strip 165 through the connector 155. As mentioned above, the functionality of the ESD transistor depends on the ballast resistance. The ballast resistance is imposed to the ESD current when the ESD current flows in the dummy gate 150. Thus, the distance between the second connector 180 and the connector 155 determines the ballast resistance for the ESD transistor. In one embodiment, there are multiple paths connecting the ESD current from the second connector 180 to the connector 155 across the ESD transistor. Advantages of the multiple paths are (i) increasing the overall resistance to the ESD current flowing within ESD transistor (ii) providing a larger area for the ESD current to flow and (iii) providing a parallel ballast resistance to the ESD current.

Figure 3:
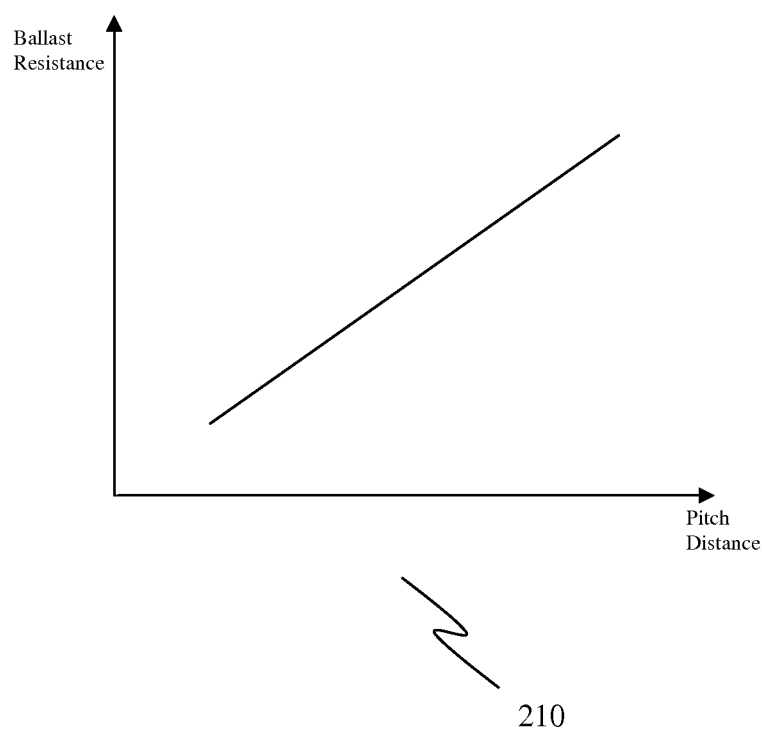
FIG. 3, meant to be illustrative and not limiting, is a graph illustrating a relationship of ballast resistance to the pitch distance in accordance with one embodiment.

FIG. 3, meant to be illustrative and not limiting, illustrates a relationship of ballast resistance to pitch distance. The pitch distance is referred to the distance between the coupling 170 to the routing structure 160 as illustrated in FIG. 2A. The FIG. 210 illustrates a linear relationship between the ballast resistances to the pitch distance. The linear relationship illustrates the property wherein the resistance increases linearly as the area that the current passes through increases linearly. In this case, as the pitch distance increases, the area that the current passes through increases and therefore the resistance increases.

Figure 4:
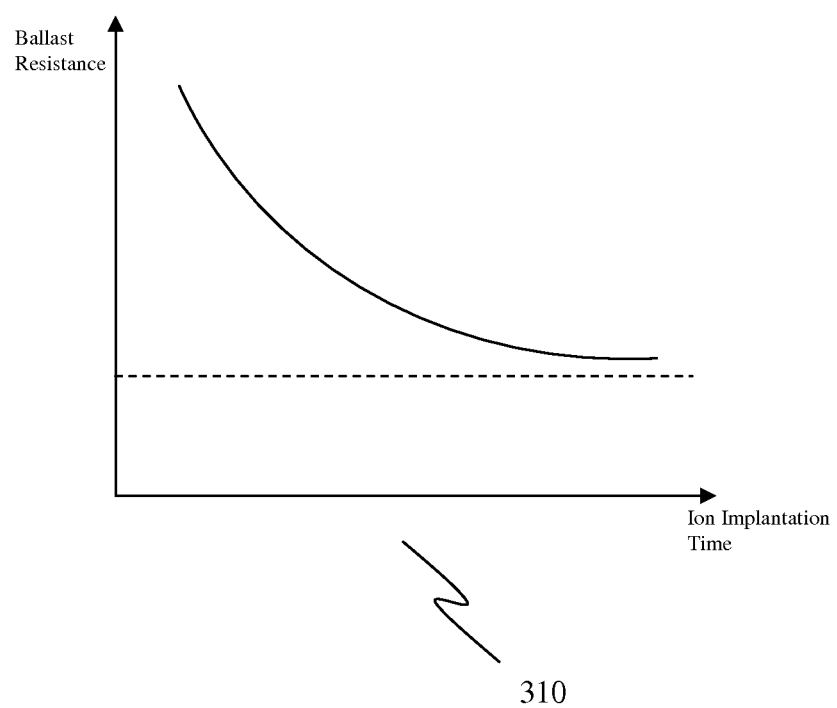
FIG. 4, meant to be illustrative and not limiting, is a graph illustrating a relationship of ballast resistance to the Ion implantation in accordance with one embodiment.

FIG. 4, meant to be illustrative and not limiting, illustrates a relationship of ballast resistance with the ion implantation. The ion implantation herein refers to implantation of N-type or P-type dopant into the second gate 150 as illustrated in FIG. 2A that is composed of the polysilicon material. The FIG. 310 illustrates an inverse relationship of ballast resistance towards the duration under ion implantation process. The inverse relationship is due to the increase of resistance linearly as the decrease of conductivity. If the duration under ion implantation process is relatively low, the amount of dopants implanted is in a smaller amount. Hence, electrical carriers generated due to the dopants within the gate is lesser, thus the gate imposes a higher resistance to an oncoming current. If the duration of ion implantation process is high, the amount of dopants implanted is higher. The gate has a higher amount of carriers and hence the gate imposes a lower resistance to the oncoming current. As the duration of the ion implantation process time increases, the ballast resistance reaches a saturation point as illustrated by an asymptote line of the relationship representing ballasts resistance with ion implantations.

Figure 5:
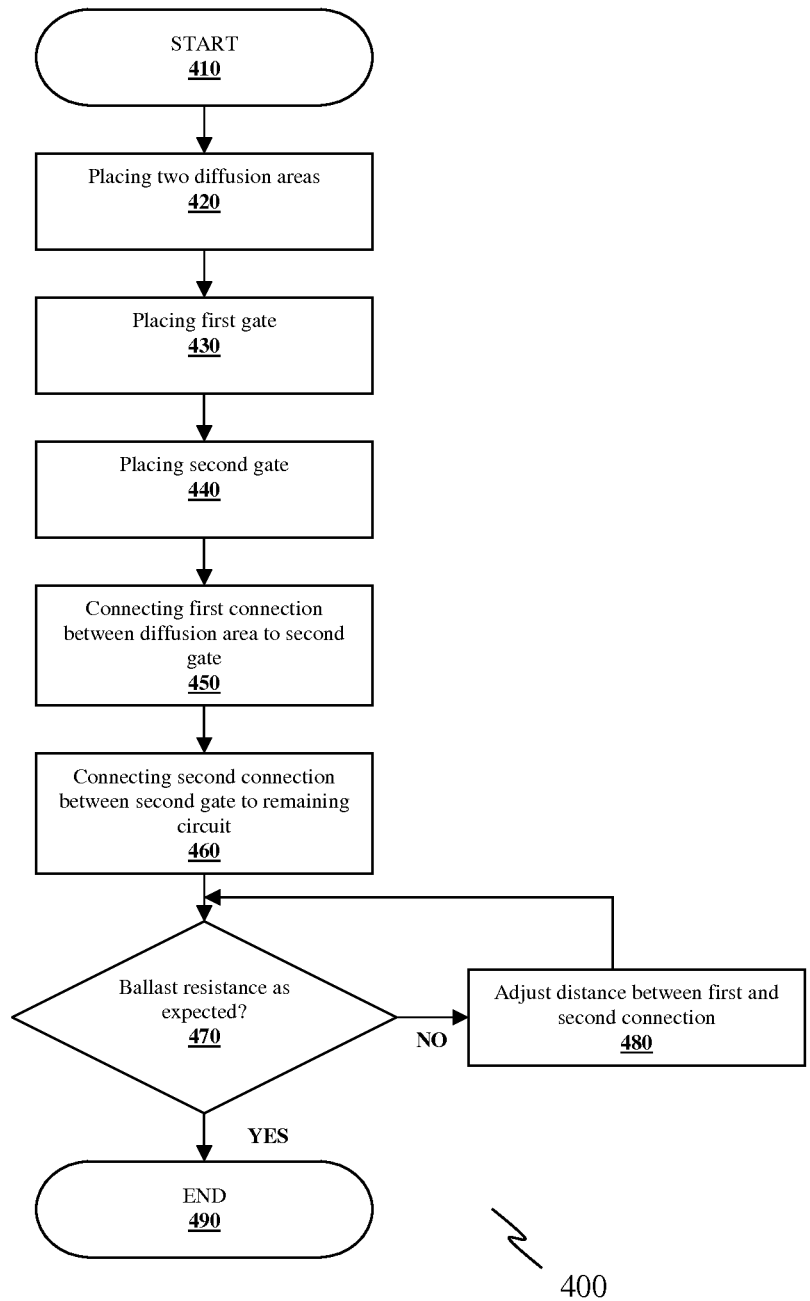
FIG. 5, meant to be illustrative and not limiting, is a flowchart of a method to fabricate an IC in accordance with one embodiment.

FIG. 5, meant to be illustrative and not limiting, illustrates a flowchart of a method to design an IC in accordance with one embodiment. The method to design the IC 400 includes placements of two diffusion areas within the IC substrate as in operation 420. In one embodiment, one of the diffusion areas is a source diffused area 120 and the other is a drain diffused area 140 as illustrated in FIG. 2B. On a p-type substrate, the diffusion areas are designed to be of n-type dopant region and on an n-type substrate the diffusion areas are designed to be of p-type dopant region. The two areas are placed a channel length distance apart. The channel length is a distance between the source and the drain on a Complementary Metal Oxide Semiconductor (CMOS) transistor, typically depending on the process node the CMOS transistor is built upon. A first gate is placed in between the two diffusion area as in operation 430, but on a layer above the substrate. In one embodiment, the first gate extends substantially parallel along the two areas and is in a plane parallel to the two areas. In one embodiment, the first gate is illustrated by the first gate 130 in FIG. 2B. A person skilled in the art appreciates there is an oxide layer that is inserted directly below the first gate and directly above the substrate. A second gate is designed on a non-diffused substrate area that is adjacent to the diffused area as in operation 440. The second gate is designed within a close proximity to the diffusion area therefore providing a connection to the diffused area. The second gate is placed substantially parallel to the first gate. One skilled in the art appreciates that the close proximity of the second gate and being substantially parallel to the first gate depends on multiple factors, such as the process capability and tolerances. In one embodiment, the second gate is illustrated by the second gate 150 in FIG. 2B.

Still referring to the FIG. 5, the diffused area is then connected to the second gate as in operation 450. The diffused area is connected to the second gate through a first interconnection. In one embodiment, the first interconnection is a coupling as illustrated in FIG. 2A that is a combination of the first connector, the metal strip and the second connector as illustrated in FIG. 2B. The method to design the first interconnection includes placing a metal strip on one of the layers above the substrate. Then, the first connector connects the metal strip's bottom surface that is just above the diffusion area to a top surface of the diffusion area. The second connector then connects the metal strip's bottom surface that is just above the second gate to a top surface of the second gate. The first and second connectors are through-hole vias in one embodiment. The metal strip is in a plane parallel to the surface of the substrate. The first and second connectors are in a plane perpendicular to the surface of the substrate. The first interconnection occupies only a portion of an overall area provided by the diffusion area and the second gate. In one embodiment, the first interconnections are placed in an equidistance manner along the second gate.

Still referring to FIG. 5, the second gate is connected to other circuitry and logic in IC as in operation 460. The second gate is connected to a remaining portion of the circuit through a second interconnection. In one embodiment, the second interconnection is the routing structure as illustrated in FIG. 2A that is a combination of the connector and the metal strip as illustrated in FIG. 2B. The second gate is connected to the remainder of the circuit through a metal strip placed on one of the layers above the substrate. A connector connects a part of the metal strips bottom surface that is just above the second gate area to the second gate. The portion of the metal strip that is not above the second gate is connected to the remainder of the circuit. The connector is a through hole via in one embodiment. It should be appreciated that the metal strip is also placed in a plane parallel to the surface of the substrate, while the connector is located in a plane perpendicular to the surface of the substrate. The second interconnection occupies only a portion of an area of the second gate. In one embodiment, the second interconnections are placed in an equidistance manner along the second gate. In another embodiment, the first interconnection and the second interconnection are placed sequentially one after another along the second gate as illustrated in FIG. 2A.

Still referring to FIG. 5, a ballast resistance on the ESD structure is calculated as in operation 470. If the ballast resistance is within an expected range, the method to design completes as in operation 490. If the ballast resistance is not within the expected range, the distance between the first and second interconnection is adjusted as in operation 480. The ballast resistance is adjusted using the relationship as illustrated through graph 210 in FIG. 3, wherein increasing the pitch distance between the first and second interconnection increases the ballast resistance and vice versa. The cycle of calculating and checking the ballast resistance 470 and adjusting the distance between first and second interconnection 480 is continued until a satisfactory ballast resistance is achieved.

The embodiments, thus far, were described with respect to integrated circuits. The method and apparatus described herein may be incorporated into any suitable circuit. For example, the method and apparatus may be incorporated into numerous types of devices such as microprocessor or programmable logic devices. Exemplary of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An electro static discharge (ESD) protection device comprising:
    a transistor that includes a gate of the transistor, a first diffusion area as a source of the transistor and a second diffusion area as a drain of the transistor, wherein the first diffusion area is adjacent to the second diffusion area, the gate covers a region between the first diffusion area and the second diffusion area, and the transistor provides protection from electrostatic discharge;
    a first dummy gate that is adjacent to the first diffusion area and is substantially parallel with the gate of the transistor, the first dummy gate having a first single, unitary body, wherein the first dummy gate provides further protection from electrostatic discharge;
    a routing structure located in a layer different than the gate of the transistor, the routing structure coupled to the first dummy gate;
    a first coupling that couples the first diffusion area to the first dummy gate;
    a second coupling that couples the first diffusion area to the first dummy gate, the second coupling in electrical parallel with the first coupling;
    a second dummy gate that is adjacent to the second diffusion area and is substantially parallel with the gate of the transistor, the second dummy gate having a second single, unitary body, wherein the second dummy gate provides further protection from electrostatic discharge; and
    a third coupling that couples the second diffusion area to the second dummy gate.

2. The ESD protection device in claim 1, wherein a plane of the first coupling is oriented perpendicularly to a plane of the gate of the transistor.

3. The ESD protection device in claim 1, wherein a ballast resistance of the first dummy gate is determined by a distance between the first coupling and the routing structure along the first dummy gate.

4. The ESD protection device in claim 1, wherein the first coupling comprises:
    a metal strip located in the layer different than the gate of the transistor; and
    a first connector extending from a surface of the metal strip to a surface of the first dummy gate.

5. The ESD protection device of claim 4, wherein the first coupling further comprises:
    a second connector extending from the surface of the metal strip to a surface of the first diffusion area.

6. The ESD protection device in claim 1, wherein the first coupling and the routing structure are sequentially disposed along a length of the first dummy gate.

7. The ESD protection device in claim 1, wherein the ESD protection device is located between a core fabric and an input/output (I/O) area of an integrated circuit (IC).

8. The ESD protection device in claim 1, wherein the first diffusion area and the second diffusion area are placed within a substrate and the gate is placed on a layer above the substrate.

9. The ESD protection device of claim 1, wherein the gate extends substantially parallel along the first diffusion area and the second diffusion area.

10. The ESD protection device of claim 1, wherein the first diffusion area is placed a channel length distance apart from the second diffusion area, and the gate covers the region defined by the channel length distance.

11. An electrostatic discharge (ESD) protection device comprising:
    a transistor that includes a gate, a first diffusion area and a second diffusion area, the gate defined in a first layer, wherein the first diffusion area is a source region of the transistor and is adjacent to the second diffusion area, the second diffusion area is a drain region of the transistor, the gate covers a region touching the first diffusion area and the second diffusion area, and the transistor provides protection from electrostatic discharge;
    a first dummy gate that is adjacent to the first diffusion area and is substantially parallel with the gate of the transistor, the first dummy gate defined as a first monolithic member in the first layer, wherein the first dummy gate provides further protection from electrostatic discharge;
    a first routing structure located in a second layer, the first routing structure coupled to the first dummy gate;
    a first coupling that couples the first diffusion area to the first dummy gate;
    a second coupling that couples the first diffusion area to the first dummy gate, wherein the second coupling and the first coupling are in electrical parallel;
    a second dummy gate that is adjacent to the second diffusion area and is substantially parallel with the gate of the transistor, the second dummy gate defined as a second monolithic member in the first layer, wherein the second dummy gate provides further protection from electrostatic discharge;

a second routing structure located in the second layer, the second routing structure coupled to the second dummy gate;

a third coupling that couples the second diffusion area to the second dummy gate; and a fourth coupling that couples the second diffusion area to the second dummy gate.

12. The ESD protection device in claim 11, wherein a plane of one of the first coupling or the second coupling is oriented perpendicularly to a plane of the gate of the transistor.

13. The ESD protection device in claim 11, wherein a ballast resistance of the first dummy gate is determined by a distance between the first coupling and the first routing structure along the first dummy gate, and by a distance between the second coupling and the first routing structure along the first dummy gate.

14. The ESD protection device in claim 11, wherein each of the first and second couplings comprise:

a metal strip located in a layer different from the first layer; and a connector extending from a surface of the metal strip to a surface of the first dummy gate.

15. The ESD protection device of claim 14, wherein the first coupling, the routing structure, and the second coupling are sequentially disposed along a length of the first dummy gate.

16. The ESD protection device in claim 11, wherein the ESD protection device is located between a core fabric and an input/output (I/O) area of an integrated circuit (IC).

17. The ESD protection device of claim 11, wherein the first diffusion area and the second diffusion area are placed within a substrate and the gate is placed on the first layer above the substrate.

18. The ESD protection device of claim 11, wherein the gate extends substantially parallel along the first diffusion area and the second diffusion area.

19. The ESD protection device of claim 11, wherein the first diffusion area is placed a channel length distance apart from the second diffusion area, and the gate covers the region defined by the channel length distance.

20. The ESD protection device of claim 11, wherein each of the third and fourth couplings comprise:

a metal strip located in a layer different from the first layer; and a connector extending from a surface of the metal strip to a surface of the second dummy gate.

* * * * *